United States Patent [19]

Turina et al.

[11] Patent Number: 4,811,079
[45] Date of Patent: Mar. 7, 1989

[54] METHOD FOR THE COLLECTIVE CHEMICAL CUTTING OUT OF SEMICONDUCTOR DEVICES, AND A DEVICE CUT OUT BY THIS METHOD

[75] Inventors: Nathalie M. Turina, Courbevoie; George Lleti, Paris, both of France

[73] Assignee: Thomson Hybrides et Microondes, Paris, France

[21] Appl. No.: 139,029

[22] Filed: Dec. 29, 1987

[30] Foreign Application Priority Data

Dec. 29, 1986 [FR] France .................... 86 18299

[51] Int. Cl.$^4$ .................. H01L 29/06; H01L 21/306; C23F 1/02; C03C 15/00
[52] U.S. Cl. ..................... 357/56; 156/649; 156/651; 156/656; 156/657; 156/659.1; 156/662; 357/15; 357/65; 437/177; 437/226
[58] Field of Search ............... 156/643, 648, 649, 651, 156/652, 656, 657, 659.1, 662; 357/15, 21, 56, 65, 67, 71; 437/177, 179, 226, 228

[56] References Cited

U.S. PATENT DOCUMENTS

| | | | |
|---|---|---|---|
| 3,288,662 | 11/1966 | Weisberg | 156/649 X |
| 3,973,320 | 8/1976 | Greco et al. | 357/81 |
| 4,029,542 | 6/1977 | Swartz | 156/649 |
| 4,304,043 | 12/1981 | Gamo et al. | 437/226 |
| 4,499,659 | 2/1985 | Varteresian et al. | 156/649 X |

FOREIGN PATENT DOCUMENTS 0052309 5/1982 European Pat. Off. .

OTHER PUBLICATIONS

Journal of The Electrochemical Society, vol. 124, No. 9, Sep. 1977, pp. 1462–1463, Manchester, N.Y., US; B. M. Armstrong et al.: "A Technique for Fabricating Oxide Passivated BARITT Diodes".

Primary Examiner—William A. Powell
Attorney, Agent, or Firm—Oblon, Fisher, Spivak, McClelland & Maier

[57] ABSTRACT

The invention provides a method for cutting out very small sized semiconductor devices, mounted on a gold base, including the formation of depth indicators etched through the active layer, on a manufacturing wafer, and penetrating into the substrate, said indicators being metallized then, after masking, the gold bases are deposited. A mechanical metal support makes it possible to thin down the substrate and to etch the mesa diodes on their gold bases, the metal of the mechanical support then being etched by an acid solution which cuts out the diodes.

8 Claims, 2 Drawing Sheets

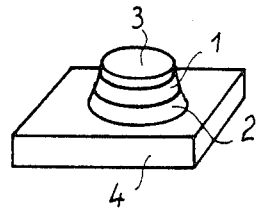
FIG_1 PRIOR ART
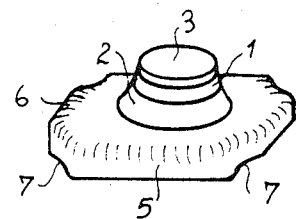
FIG_2
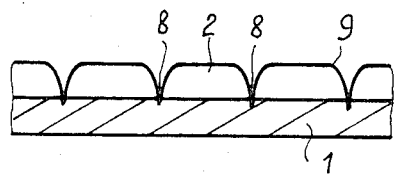
FIG_3
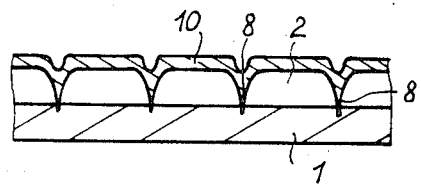
FIG_4
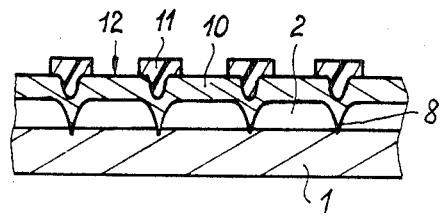
FIG_5
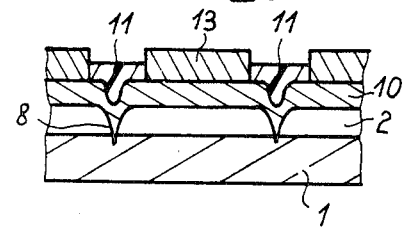
FIG_6
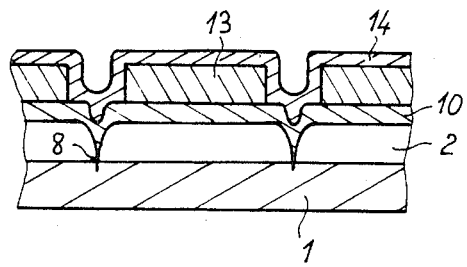
FIG_7
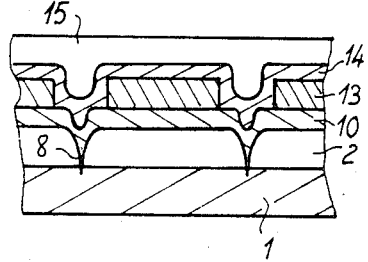
FIG_8

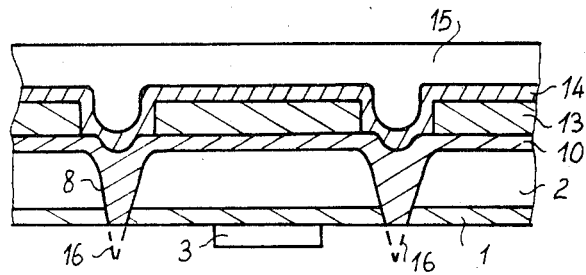
FIG_9
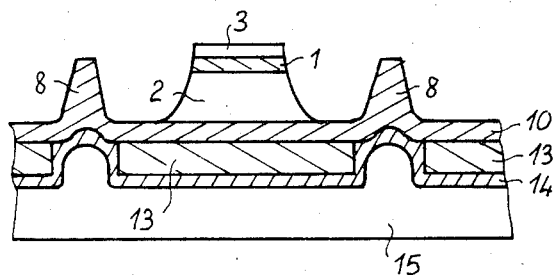
FIG_10
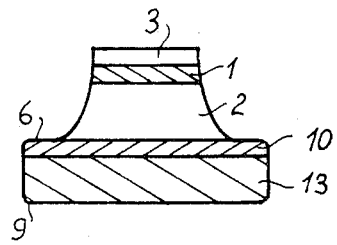
FIG_11
FIG_12
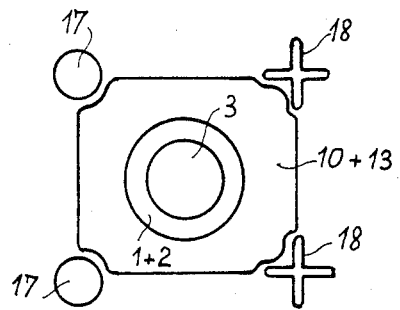

METHOD FOR THE COLLECTIVE CHEMICAL CUTTING OUT OF SEMICONDUCTOR DEVICES, AND A DEVICE CUT OUT BY THIS METHOD

BACKGROUND OF THE INVENTION

The present invention relates to a method of cutting out semiconductor devices of very small size, mounted on an integrated gold dissipator. The semiconductor devices concerned by the invention are essentially diodes, produced collectively on a semiconductor material wafer: they are separated into discrete elements, in accordance with the invention, by chemically cutting out the wafer.

The diodes concerned by this chemical cutting out process may be of different types: junction, Schottky, PIN, IMPATT diodes . . . ; etc, and be formed on silicon or on materials of the III-V familes such as GaAs or InP for example. It should be understood by very small size that the chips of each diode have sides of about 200 microns; these are then essentially ultrahigh frequency diodes, although the method can be applied to low power low frequency diodes and so of small size.

Some applications require each diode to have an integrated gold base which serves as heat dissipator. This base is fixed to a good electric and heat conducting material, which is the heat sink properly speaking.

Up to now the formation of such diodes has been obtained by a collective process, but the final separation of each discrete component has been achieved by mechanical cutting out. In fact, cutting out using a laser ray is not possible because of the base. Mechanical cutting out using cutting blades is then used but remains very delicate since the chips have sides of about 200 microns: it is a very precise, long and consequently expensive operation.

SUMMARY OF THE INVENTION

In accordance with the invention, the diodes are formed on a semiconductor substrate, then constant depth indicators are etched into the semiconductor wafers: the indicators must pass through the active layer or layers of the diode and penetrate as far as the substrate. The surface of the active layer and the holes of the indicators are covered with a layer for fixing the gold bases which are then created, after appropriate masking. A thick layer of a chemically etchable metal is deposited over the whole face of the wafer, which is then mechanically ground on its semiconductor substrate face until the buried ends of the depth indicators appear. There thus only remain the active layer or layers and a small substrate thickness. The contact making metallizations are deposited, using known techniques, in appropriate positions on what remains of the substrate, then the chemical etching of the mesas, for each diode, stops at the gold base. Thus a metal wafer is obtained which includes a plurality of mesa diodes each fixed to their gold base. Then by chemical etching of the metal wafer the diodes are separated into discrete elements.

More precisely, the invention provides a method for the collective chemical cutting out of semiconductor devices, fixed to a gold base of very small size (200 microns) including a preliminary step for forming at least one semiconductor layer on a semiconductor material substrate, forming a diode junction, this method being characterized in that it includes the following steps:

(1) etching depth indicators in the semiconductor layer, all of the indicators having the same depth and penetrating into the substrate, at the rate of at least one indicator between two future diodes, (2) depositing, on the semiconductor layer and in the holes of the indicators, a metal layer for fixing to the semiconductor material, (3) masking on the fixing layer and etching of the mask for freeing the windows corresponding to the future gold bases, (4) electrolytic deposition of the gold bases in the windows of the mask, (5) dissolution of the mask and deposition of a metal diffusion arresting layer, on the gold bases and the visible parts of the fixing layer, (6) growth on the antidiffusion layer of a thick layer of a mechanical support metal etchable by a chemical solution which does not etch gold, (7) thinning of the semiconductor substrate until the depth indicators appear, (8) masking the semiconductor substrate, etching the mask and depositing contact making metallizations on the diodes, (9) etching of the mesas of the diodes,

(10) collective chemical cutting out into discrete elements by chemically etching the mechanical support metal layer and the fixing layer.

BRIEF DESCRIPTION OF THE DRAWINGS

The invention will be better understood and its advantages will be clear from the following description of one chemical cutting out example, this description referring to the accompanying drawings which show:

FIG. 1: a diode on a gold base of the prior art,

FIG. 2: a diode on a gold base according to the invention,

FIGS. 3 to 11: the different steps of the manufacturing and chemical cutting out method of the invention, FIG. 12: a diode cut out using the method of the invention, seen from above.

DESCRIPTION OF THE PREFERRED EMBODIMENT

Although the invention applies generally to all small sized semiconductor devices, whether they are formed on silicon or on a III-V type material, and whether the diodes thus produced have an active layer, as is the case for a junction diode, or a plurality of layers, as is the case for the PIN diodes, the invention will be described with reference to a silicon junction diode, so as to simplify the text and the FIGS. and make the invention more readily understandable.

FIG. 1 shows a three quarter view in space of a diode on a gold base, of the prior art. Such a diode has at least one junction between two layers 1 and 2 of materials with opposite conductives and, when the application requires the diode to be mounted on a gold base, it is etched as a mesa. The electric contacts are taken by a metallization 3 on the top of the mesa and through the gold base 4 which is then soldered to a support, generally made from copper which serves for cooling the diode during operation. The structure of such a diode requires the gold base to be formed during manufacture, for it will be readily understood that it is impossible to solder such a small diode pellet on a gold base which has been produced separately.

Consequently, the problem of cutting out diodes which are produced collectively is related to the presence of the gold base, which prohibits the use of a laser and automation of the cutting out of a semiconductor wafer, but it is also related to the very small sizes of the ultrahigh frequency diodes. The diodes on a gold base of the prior art are therefore cut out mechanically, using a blade, which gives to the base 4 square or rectangular dimensions, and the cutting out forms sharp edges. The diode on a gold base of the invention, shown in FIG. 2, includes a semiconductor portion which is comparable to the diode of the prior art. It is formed by the junction between two layers of material 1 and 2, of opposite conductivity types, a metallization 3 being deposited on the top of the mesa. But the gold base 5, cut out chemically, has a double feature. On the one hand it has no sharp edge, but is rounded on its edges at 6, so that there is only a single surface which passes from the upper face to the lower face of the gold base without a sharp edge; this surface is curved and the rounded form of the edges of the base is a consequence of the manufacturing method which will be explained further on.

Furthermore, the corners of the gold base 5 have traces at 7 which are the remains of the etching indicators: the presence of truncated corners of the gold base 5 will be better understood from the following description of the manufacturing and chemical cutting out method.

To produce diodes, by a collective method, and cut them out chemically, the present invention provides a semiconductor wafer 1 on which a layer of a semiconductor material 2 can be grown or—although it is not shown in the Fig.—a plurality of layers if it is a question for example of a PIN diode. Layer 2, which was deposited by epitaxy, will form the future active layer of each diode. Then depth indicators 8 are etched in the semiconductor wafer, from the face supporting the active layer, and these indicators must be fairly deep so as to penetrate as far as the substrate 1. If the active layer has for example a thickness of 1 micron, each pattern is etched over a thickness of 5 microns, and there may be four patterns for locating a diode, at the four corners of the future gold base. But it is also possible to have less depth indicators 8, at the rate of one indicator between 4 diodes for example. This is not shown in FIG. 3, but it is obvious that such indicators are etched over the whole semiconductor wafer in the form of an even meshed grid. Chemical etching of the depth indicators 8 is in accordance with the known crystallography rules and using an appropriate chemical solution, but it so happens that during such chemical etching the angles at 9 of the patterns revealed in the active layer 2 are rounded, which is the attribute of any chemical etching.

The depth indicators may be of different shapes and, seen from the top, they may be circles, which gives then a hole 8 in the form of a truncated cone, or crosses which then gives cross shaped holes 8.

The next operation shown in FIG. 4 consists in depositing on the semiconductor material a metallization layer 10 of a metal for fixing the metal dissipator. This fixing layer, deposited on the active layer 2, may be for example chromium/platinum/gold or the well known chain silicon/platinum-titanium-platinum-gold. This metal layer 10 fills the holes of the depth indicators 8 and penetrates then into the substrate 1.

Using known techniques, the fixing metal layer 10 is then covered by a masking layer which is either made from a photosensitive resin, or is a mineral layer, that is to say made from silica, or silicon nitride, or aluminium nitride ... etc. This layer is then etched so as to leave islets 11, which are of meshed form and which leave apparent, between their mesh, holes 12 which correspond to the future gold bases.

So as to better show the details of the structure, FIG. 6 and the following Figs. only show a region of a circle which corresponds to a diode, shown on a larger scale.

The next operation consists then in causing an electrolytic growth of gold in the unmasked zones, consequently in opening 12. This electrolytic gold growth provides then a gold base 13, which has been able to grow because of the presence of the metal fixing layer 10.

The resin or silica mask 11 is then eliminated by appropriate solvents, and consequently, the face, on the active layer side, of the semiconductor material circle will, after dissolution of mask 11, be entirely made from metal and will include either gold bases 13 or the apparent portions of the metal fixing layer 10.

In FIG. 7, the operation consists in depositing, on the metal side of the wafer, a layer 14 of nickel which forms a diffusion barrier, so as to prevent diffusion into the gold bases 13 of the copper or any usual metal such as tin, silver, lead, iron. This copper layer, shown at 15 in FIG. 8, is sufficiently thick to form a rigid substrate for the rest of the operations. However, the copper may be replaced by any other metal, provided that this metal is etched by a chemical solution, without the gold of bases 13 being etched.

In FIG. 9, the metal layer 15 then serving as metal support for the plurality of diodes which adhere thereto, the semiconductor substrate 1 is ground until the tip or buried end 16 of the depth indicator 8 appears. Thinning of substrate 1 may also be carried out chemically or using a plasma. Such thinning stops when the ends 16 of the depth indicators are seen, shown with broken lines, and this means then that all the depth indicators are formed with great regularity so as to ensure regularity of the thickness of the remaining layer of substrate 1.

Using known methods, which it is therefore not necessary to describe in detail, the free face of what remains of substrate 1 is then masked, and the metallizations 3 for making contact on the diode are deposited in appropriate positions.

Then, with the wafer turned over in FIG. 10, each diode is isolated by etching a mesa, metallization 3 serving as etching mask. At this point of the collective manufacture of the diodes, a wafer has then a mechanical support 15, made from copper or tin or silver ... etc on which mesa diodes are fixed, each being centered on the gold base 13. However, between the diodes appear the depth indicators 8 which are not etched during the operation for etching the mesas.

The chips are separated by etching the copper of support 15 and the nickel of the diffusion barrier layer 14 using nitric acid, at 70° C., in a normal solution. Such etching is promoted by the combined action of ultrasounds and it lasts about 30 minutes. However, other solutions other than nitric acid may be used, and all chemical solutions which attack metals are suitable provided that they do not attack the gold, or the semiconductor materials of diode 1+2.

During this chemical etching, and as shown in FIG. 11, the edge 6 of the metal fixing layer 10 is slightly etched, which gives it a rounded shape. Furthermore, and following the chemical etching of the depth indicators 8 which had rounded angles 9, the gold base 13 itself has rounded angles, and there is no sharp edge in the base of the diodes formed and separated chemically. It is then the same surface which by curvature forms the upper surface and the lower surface of the gold base 13, and this base has no sharp edge as in the prior art.

Furthermore, as shown in FIG. 12, a gold base has special features at its angles. This Fig. shows a diode, with a gold base cut out chemically using the method of the invention, seen from the top. On the left hand portion are shown the traces of two depth indicators 17 which have a circular section, whereas on the right hand portion of the Fig. are shown the traces of two depth indicators 18 which have a cross shaped section. During the different masking then etching operations, throughout the process, these indicators have left a trace which is to be found at the corners of the gold base, this gold base being very generally of square shape. In the present case, the chemically cut out gold base has corners which have a shape which recalls the presence of the depth indicators during the manufacturing process: the corners of the gold base reproduce the profile of the depth indicator 17 or 18 depending on the case. Furthermore, it is not necessary for the four corners to be thus marked by the trace of the depth indicators and there may only be one corner marked, if for example it is decided to put a depth indicator at the intersection of four diode pellets. However, it is obvious that the process is carried out with much greater precision if there is a depth indicator at each diode corner.

The method which has just been described is not limited to the single application which has been described, but all modifications which come within the scope of the invention and which are obvious for a man skilled in the art, such for example as the separation by chemical cutting out of InP diodes, or diodes having a plurality of active layers, belong to the field of the invention which is stated precisely in the following claims.

What is claimed is:

1. A method for the collective chemical cutting out of semiconductor devices, fixed to a gold base of very small size (200 microns) including a preliminary step for forming at least one semiconductor layer on a semiconductor material substrate, forming a diode junction, said method further including the following steps:
   (1) etching depth indicators in the semiconductor layer, all the indicators having the same depth and penetrating into the substrate, at the rate of at least one indicator between two future diodes,
   (2) depositing, on the semiconductor layer and in the holes of the indicators, a metal layer for fixing to the semiconductor material,
   (3) masking on the fixing layer and etching of the mask for freeing the windows corresponding to the future gold bases,
   (4) electrolytic deposition of the gold bases in the windows of the mask,
   (5) dissolution of the mask and deposition of a metal diffusion arresting layer, on the gold bases and the visible parts of the fixing layer,
   (6) growth on the antidiffusion layer of a thick layer of a mechanical support metal etchable by a chemical solution which does not attack gold,
   (7) thinning of the semiconductor substrate until the depth indicators appear,
   (8) masking the semiconductor substrate, etching the mask and depositing contact making metallizations on the diodes,
   (9) etching of the mesas of the diodes,
   (10) collective chemical cutting out into discrete elements by chemically etching the mechanical support metal layer and the fixing layer.

2. The method as claimed in claim 1, wherein said layer for fixing the gold base on the semiconductor material is formed by the metal chain Si Pt/Ti/Pt/Au or by Cr/Pt/Au.

3. The method as claimed in claim 1, wherein the mask for forming the gold bases is organic or mineral, made from silica, silicon nitride, aluminium nitride.

4. The method as claimed in claim 1, wherein said diffusion barrier layer is made from nickel.

5. The method as claimed in claim 1, wherein the thick metal mechanical supporting layer is made from a metal chemically etchable by a solution which does not attack gold, such as copper, or tin, or silver.

6. The method as claimed in claim 5, wherein the solution for chemically etching the thick layer is a normal nitric acid solution at 70° C., used for 30 minutes with activation by ultrasounds.

7. A semiconductor device fixed on a gold base, cut out chemically using the method of claim 1, wherein a curved surface joins the two main surfaces of the gold base together without sharp edges.

8. A semiconductor device fixed on a gold base, cut out chemically using the method of claim 1, wherein at least one angle of the gold base carries the trace of at least one depth indicator.

* * * * *

UNITED STATES PATENT AND TRADEMARK OFFICE
CERTIFICATE OF CORRECTION

PATENT NO.  : 4,811,079
DATED       : Mar. 7, 1989
INVENTOR(S) : Nathalie TURINA MALLARD, et al.

It is certified that error appears in the above-identified patent and that said Letters Patent is hereby corrected as shown below:

The names of the inventors are corrected as follows:

-- Nathalie TURINA MALLARD; Georges LLETI --

Signed and Sealed this

Tenth Day of October, 1989

Attest:

DONALD J. QUIGG

Attesting Officer

Commissioner of Patents and Trademarks